(12) United States Patent
Dempsey (10) Patent No.: US 9,583,241 B1
(45) Date of Patent: Feb. 28, 2017

(54) PROGRAMMABLE IMPEDANCE

(71) Applicant: ANALOG DEVICES GLOBAL, Hamilton (BM)

(72) Inventor: Dennis A. Dempsey, County Tipperary (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/823,843

(22) Filed: Aug. 11, 2015

(51) Int. Cl.
*H03M 1/66* (2006.01)
*H01C 13/00* (2006.01)
(52) U.S. Cl.
CPC .............. *H01C 13/00* (2013.01); *H03M 1/66* (2013.01)
(58) Field of Classification Search
CPC ......... H03M 1/00; H03M 1/747; H03M 1/785

USPC ................ 341/145, 144, 153, 154, 150, 110
See application file for complete search history.

(56) References Cited

U.S. PATENT DOCUMENTS

| 4,673,807 | A | * | 6/1987 | Kobayashi ......... G01N 21/5907 |
| | | | | 250/214 AG |
| 5,495,245 | A | | 2/1996 | Ashe |
| 6,414,616 | B1 | | 7/2002 | Dempsey |
| 6,885,328 | B1 | | 4/2005 | Kao et al. |
| 7,956,786 | B2 | | 6/2011 | Cosgrave |
| 8,284,014 | B2 | | 10/2012 | Jha |
| 2010/0052963 | A1 | * | 3/2010 | Soude ................... H03M 1/808 |
| | | | | 341/144 |

* cited by examiner

*Primary Examiner* — Joseph Lauture
(74) *Attorney, Agent, or Firm* — Patent Capital Group (57) ABSTRACT

The present application relates generally to programmable impedances and employs an auxiliary impedance in parallel to a primary programmable impedance to augment the performance of the primary programmable impedance at lower impedance values.

19 Claims, 8 Drawing Sheets

PROGRAMMABLE IMPEDANCE

FIELD OF THE APPLICATION

This present application relates generally to a digitally programmable impedance or resistance, which may for example be employed in a digital-to-analog converter (DAC).

BACKGROUND

It will be appreciated by those skilled in the art that rheostats and potentiometers are closely related with a rheostat or variable resistance equivalent to a potentiometer where the output terminal and one of the two reference terminals are employed. In both cases there is a variable resistor.

In the case of a digitally programmable resistor, the value of resistance is set in response to a digital input value.

A common type of digital rheostat employs a resistor string. The programmable nature of the resistance is obtained by having each node in the string coupled by a switch to an output terminal.

With a single resistor string, as the word length or resolution of the digital input increases, the required number of switches and resistors also increases with the number of switches and resistors equating to $2^N$ where N is the length in bits of the digital word. The word length is also referred to commonly as the binary resolution of the resistor string.

Correspondingly, the incremental difference in resistance decreases as the word length increases for a given total resistance. It will be appreciated that this equates to the resistance for the LSB.

Multi-stage digitally programmable resistors are known in which the resistance value is the series combination of a plurality of different resistance stages with a first stage converting the Least Significant Bits (LSBs) into a resistance value and the second stage converting the Most Significant Bits (MSBs) into a resistance value optionally including one or more intermediate stages handling the intermediate bits of the digital input word. This approach reduces the number of resistors and switches required. This provides for improved circuit performance while reducing integrated circuit area and reducing test cost.

However, the resistance corresponding to that of the LSB remains the same. As the length of the digital input word increases, for a given target total resistance value, the resistance of the LSB decreases with the result that the ON resistance of switches $R_{on}$ becomes significant and distorts the overall resistance value.

Accordingly, if a circuit designer is looking to employ either one or both of a low target total resistance or higher resolution, the switch resistances can significantly impact on performance.

This is particularly so in thR case of multi-stage programable resistors, where there are multiple switches coupled in series between the two terminals which presents limitations on the performance of multi-stage architectures.

SUMMARY

In a first aspect, the present application provides a programmable impedance providing an impedance value across two nodes. The programmable impedance is responsive to an input code word in providing the impedance value. The programmable impedance comprises a first branch couplable between the two nodes for use in providing impedance values across a first range of the input code word and a second branch couplable between the two nodes for use in providing impedance values across a second range of the input code word.

The input code word suitably comprises a plurality of bits and the first branch is responsive to all bits of the plurality of bits. In contrast, the second branch is responsive to a limited set of the plurality of bits.

The first and second ranges may or may not overlap.

The first branch has minimum intrinsic impedance which it can present across the two nodes. The second branch may be employed to allow a impedance value below this minimum to be presented across the two nodes.

The second branch may only be used to provide an impedance value in response to a input code word value in the range from 0 to M, where M≥1 in which case the first branch is employed to provides an impedance value for an input code word value in a range comprising at least M+1 to the maximum value of the input word.

Generally, there will be more than one value associated with the auxiliary branch and accordingly the second branch may be employed to provide an impedance value in response to a input code word value in the range from 0 to M, where M>1. In this case, the first branch may be employed to provide an impedance value for an input code word value in a range comprising at least M+1 to the maximum value of the input word.

The second branch may comprise a plurality of switches arranged in parallel in which case the plurality of the switches are selectably switchable to effect a desired impedance reflective of the input digital word. In this arrangement, the plurality of switches may be scaled relative to one and other.

Alternatively, the second branch may comprise at least one controllable impedance and where the impedance is controlled to effect a desired impedance reflective of the input digital word. Suitably this control is by means of a control voltage.

The impedance of the first branch may be decoupled between the two nodes when the second branch is coupled between the two nodes. Similarly, the second branch may be decoupled when the first branch is coupled.

The first and second ranges may or may not overlap.

The first branch may comprise a multi-stage digitally controlled impedance.

The first branch may comprise a switchable resistor array.

The programmable impedance may be used in a digital to analog converter.

A further aspect provides a method of providing an impedance in response to an input value. The method comprises determining if the value is within a determined range of operation of a first programmable impedance; upon making such a determination, using the first programmable impedance to provide the impedance value; and otherwise using a second programmable impedance to provide an extended range of operation, where the extended range of operation provides lower impedance values than those of the determined range of operation. The method may further comprise coupling the first and second programmable impedances in parallel for the extended range of operation.

Another aspect provides a circuit element providing an impedance value across two nodes in response to an input code word. The circuit element comprises a primary branch, coupled between the two nodes, comprising a programmable impedance responsive to the input code word to provide a corresponding impedance between the two nodes;

an auxiliary branch coupled between the two nodes and comprising at least impedance switchably couplable between the two nodes, wherein the auxiliary branch is employed to augment the performance of the primary branch allowing for a lower impedance value to be provided between the two nodes than the programmable impedance is capable of providing. These and other aspects features and advantages will become apparent from the description which follows.

DESCRIPTION OF DRAWINGS

The present application will now be described with reference to the drawings, in which like reference numerals refer to like features, and in which.

DETAILED DESCRIPTION

Figure 1:
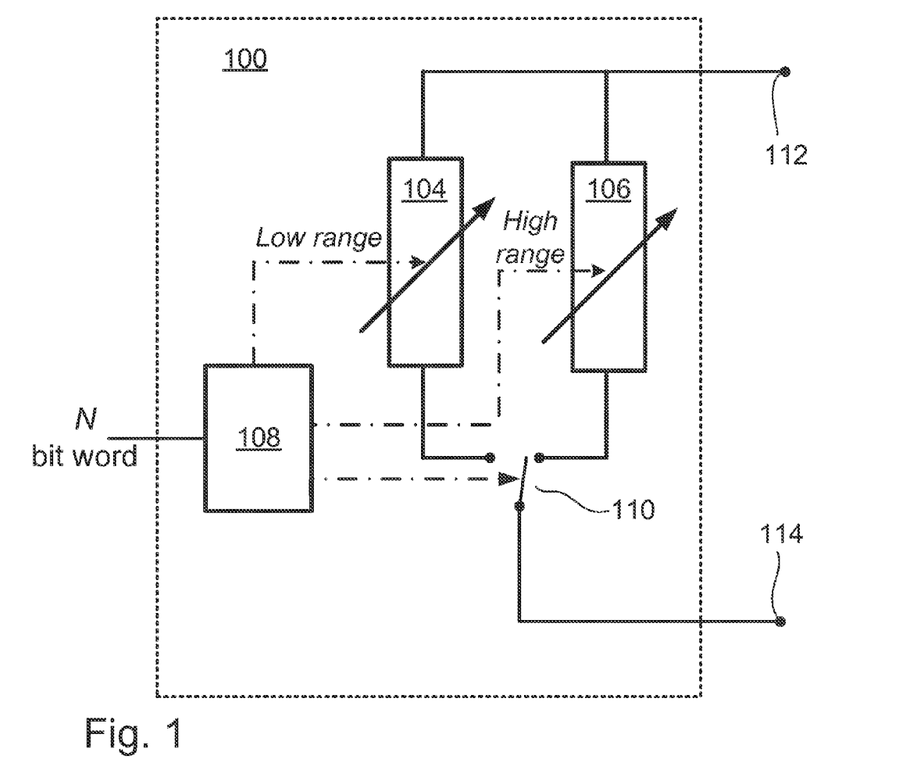
FIG. 1 illustrates a branched programmable resistor according to a first aspect of the present application comprising a primary branch and an auxiliary branch.

An exemplary aspect of the present application is shown in FIG. 1, in which a digitally programmable impedance 1 is shown providing a programmed impedance value between two nodes 112, 14 in response to a digital N bit input word.

It will be appreciated that generally for digitally programmable resistor, the resistance value provided equals $X/(2^N-1)*(R*2^N-1)$, which simplifies to $X*R$, for $2^N-1$ resistors respectively where X is the value of the input word and R is the value of LSB resistance for the digitally programmable resistor.

The digitally programmable resistor 1 comprises a first or primary branch having a primary programmable impedance 106 and a second or auxiliary branch having an auxiliary programmable impedance 104.

The first and second impedances 104, 106 are controlled by a logic control block 108 acting upon a binary word input. The general function of the programmable impedance 100 is to present an impedance value across the output nodes 112, 114 reflective of the value of the input word.

One or other of the first and second programmable impedances are selected to provide an impedance value between output nodes 112 and 14. The selection of the primary or auxiliary impedance is illustrated by means of a switch 110, which is also responsive to the input word.

Figure 1A:
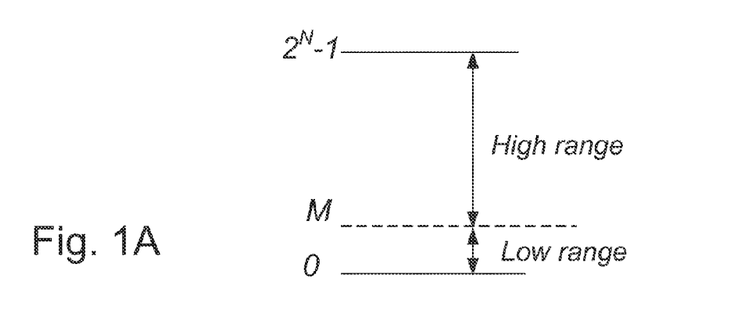
FIG. 1A illustrates low and high ranges of FIG. 1.

More particularly, the primary programmable impedance 106 is configured to generally present an impedance across the output terminals in response to the values of the individual bits of the input word. Suitably, the programmable resistance operates over a significant range (shown as high range) which extends downward from the maximum impedance values. This may be for example $(2^N-1)R$ in some converters and $2^N R$ in others depending on the configuration, where R is the impedance equivalent to the LSB. R is therefore sometimes referred to as the LSB equivalent impedance.

As explained in the background, at lower input values, the impedance presented from conventional programmable impedance may no longer accurately reflect the input value.

The present application addresses this by providing an auxiliary programmable impedance which only operates over this low range.

Thus in the arrangement shown, switch 110 is employed to transfer responsibility over to the auxiliary programmable impedance 104 to ensure the correct impedance for a low input value is presented across the output nodes 112 and 114.

It will be appreciated that the decode logic of the logic control block to effect control of the primary and auxiliary impedances 104, 106 and switch 110 are readily implementable by those skilled in the art using conventional address decode or similar techniques.

Suitably, the primary programmable impedance is responsive to provide an impedance value across a wide resistance range with the auxiliary programmable impedance is responsive to augment the performance of the primary programmable impedance over a relatively narrow range.

As an example, consider an N (e.g. 112) bit converter, where the input can be within a range of values between a minimum and a maximum value (e.g. 0 and 4095). The auxiliary branch may be employed only for a low range representing a small subset of values at the bottom of the range (e.g. between 0 and 15 or less for example between 0 and 5) with the remaining values in the range (e.g. between 16 and 4095 (or 5 and 4095) provided by the primary branch.

An advantage of using a separate auxiliary branch, whose use is restricted to a relatively small region of the range is that it obviates problems associated with switch resistances, leakage and speed in a comparable programmable impedance designed to operate over the entire range (e.g. 0 to 4095). This allows for a higher resolution (dynamic range) than conventionally available. It also reduces the problems associated with selecting a low value for the minimum switch impedance $R_{on}$. This in turn results in improved performance including, for example, lower cost, chip space, leakage, capacitance and a wider bandwidth. Equally, it may be considered to enable the use of switches with higher values of $R_{on}$, lower capacitance and leakage. It will be appreciated that this results in improved circuit performance, for example, in situations where the programmable resistor is used in a DAC.

It is to be noted that the separate auxiliary branch is not equivalent to an LSB stage of a series multi stage programmed impedance where different bits are grouped together and provided to stages which convert them to different impedances which are aggregated together to provide an overall resistance since in such an arrangement there is no range as such where the LSBs are not required. For example when a value changes from 3091 to 3092, there is a change required in the LSB value of a multi-stage programmed impedance. Instead, the auxiliary branch augments the performance of the primary branch at the lower end of the input range.

Or stated another way, the primary branch is responsive to all of the bits of the N-bit word and provides an output over a first range and the auxiliary branch is operable over a second range and where the first range is significantly greater than the second, for example a factor of 100 or more times greater. The auxiliary branch is effectively only responsive to a limited number of the LSBs of the N bit word but is disabled when the value of the N-bit word is outside the low range. It will also be appreciated that the first and second branches are arranged in parallel and coupled to the output nodes 112, 114.

This approach of using an auxiliary branch when providing for the low range values removes the difficulty of having the primary branch operate on its own over the entire range which can be difficult as the number of bits increases.

Figure 2A:
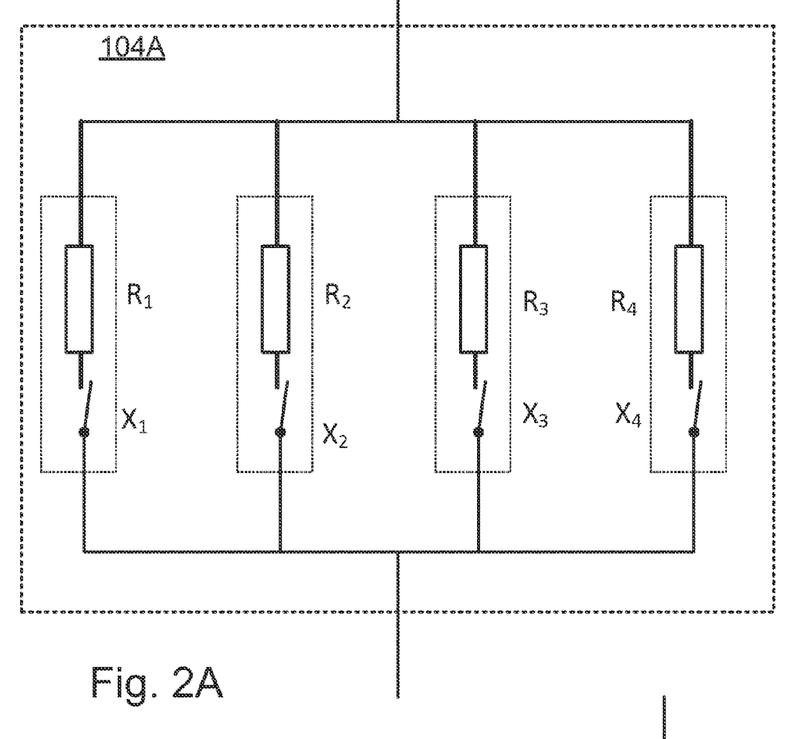
FIGS. 2A and 2B illustrates exemplary approaches to the auxiliary branch of FIG. 1.

An exemplary arrangement for the auxiliary branch (low range) impedance 104 of FIG. 1 is shown as element 104A in FIG. 2A. Thus element comprises a plurality of switches $X_{1-4}$ arranged in parallel. Each of the switches has an associated resistance $X_{1-4}$ in series with it. The associated resistances may be discrete resistors or may be the intrinsic on-resistance of the switch or a combination of both. Accordingly, by closing a switch an associated resistance is connected across the output of the auxiliary branch. It will be understood by those skilled in the art, that the resistance values $R_{1-4}$ do not necessarily correlate directly to the LSB resistance R.

In one arrangement, each of the resistors in the auxiliary branch has a different resistance value. Thus in the case of the arrangement shown, the resistance of the second resistor $R_2$ could be scaled to be twice that of the first resistor $R_1$ with the third resistor being three times the resistance of the first resistor and with the fourth resistor being four times the resistance of the first resistor. It will be appreciated that the value of the first resistor represents the lowest resistor value corresponding to a binary input of 01, with the second resistor representing twice this with a binary input of 110 and so on.

Whilst, the resistor values are shown as discrete elements, the dashed outline is to represent that the resistance may not be a discrete resistance and may be the intrinsic resistance of the switch itself, i.e. the on resistance ($R_{on}$) for the switch. It will be appreciated that the required different values of resistance, e.g. $R_{1-4}$ may readily be obtained by scaling of the respective switch sizes.

Alternatively, switches may be placed in series with or without separate impedances to achieve a desired value. Thus for example, if $R_1$ is provided by a switch of a first size then $R_2$ may be provided by two such switches placed in series.

Equally, whilst it will be appreciated that parallel switched configurations of switches may be employed to provide a desired resistance value from the auxiliary branch. Equally, series parallel combinations may be employed. Nonetheless, it will be appreciated that switching a single impedance at a time has the advantage of facilitating a one-button hot decode.

Figure 2B:
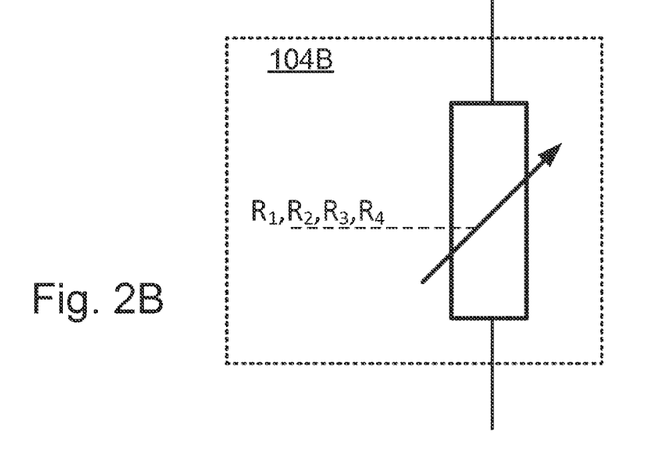

Additionally, whilst switches may be employed to selectively provide a desired impedance in the auxiliary branch, an alternative approach, shown in FIG. 2B, is to employ a controlled impedance 104B and to adjust the value of the controlled impedance so as to achieve a desired impedance. An exemplary way of providing such controlled impedance in the context of a DAC is described in U.S. patent application Ser. No. 14/214,405 the entire contents of which are herein incorporated by reference.

The primary programmable impedance or branch may be a resistor string or resistor array.

Figure 3:
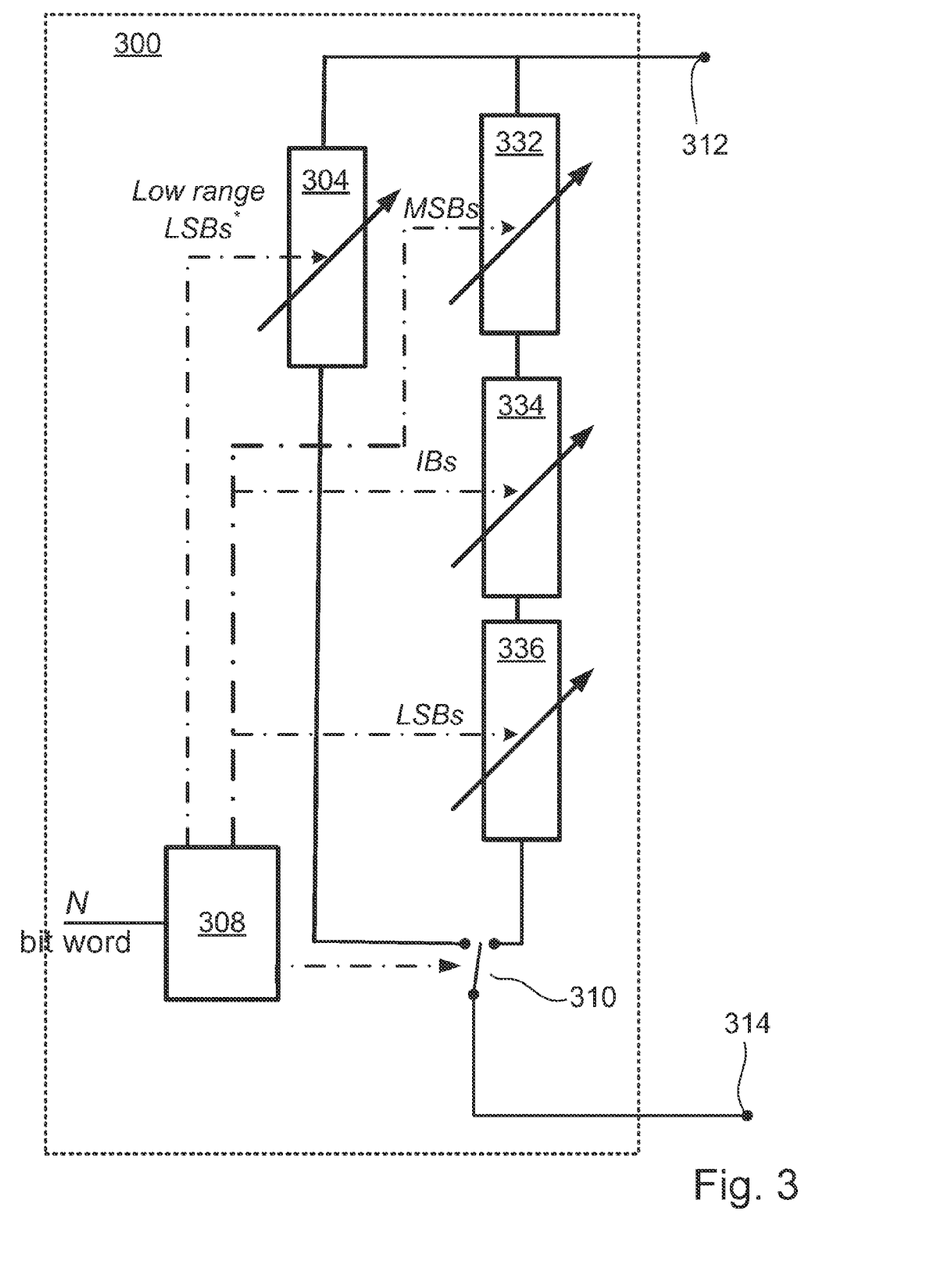
FIG. 3 illustrates a multi-stage approach to the arrangement of FIG. 1.

The primary programmable impedance may be arranged as number of stages connected in series. In this respect, an arrangement 300 using a multi-stage impedance as the primary stage is shown in FIG. 3 coupled to and providing an impedance across output nodes 312,314. The multi-stage programmable impedance comprises a number of stages 332, 334, 336 arranged in series and in which a MSB stage 332 provides impedances corresponding to the most significant bits of the input word. An LSB stage 336 provides impedances corresponding to the least significant bits of the input word. An intermediate stage 334 provides impedances corresponding to the intermediate bits between the MSBs and LSBs. It will be appreciated that there may be only two stages 332, 336 or there may be more than three stages. Equally, whilst generally the number of bits handled by each stage may be the same, this is not essential. Thus in a 10 bit programmable resistor, the LSB stage 336 might be responsive to the four LSBs, the intermediate stage 334 responsive to the next four bits and the final two bits (MSBs) handled by the MSB stage 332. Equally, whilst the arrangement is shown in a logical fashion ordering the MSBs, IBs and LSBs from top to bottom, it will be understood that this is simply for convention and is not a functional requirement.

It will be appreciated that the functionality of switch 110 is to engage the auxiliary branch as required. In the case of FIG. 3, this is by preferentially selecting one branch over the other. It will be appreciated that this does not require a discrete separate switch, such as switch 110 shown, instead switches within the branch elements may be employed as required to select one branch over the other.

Figure 4:
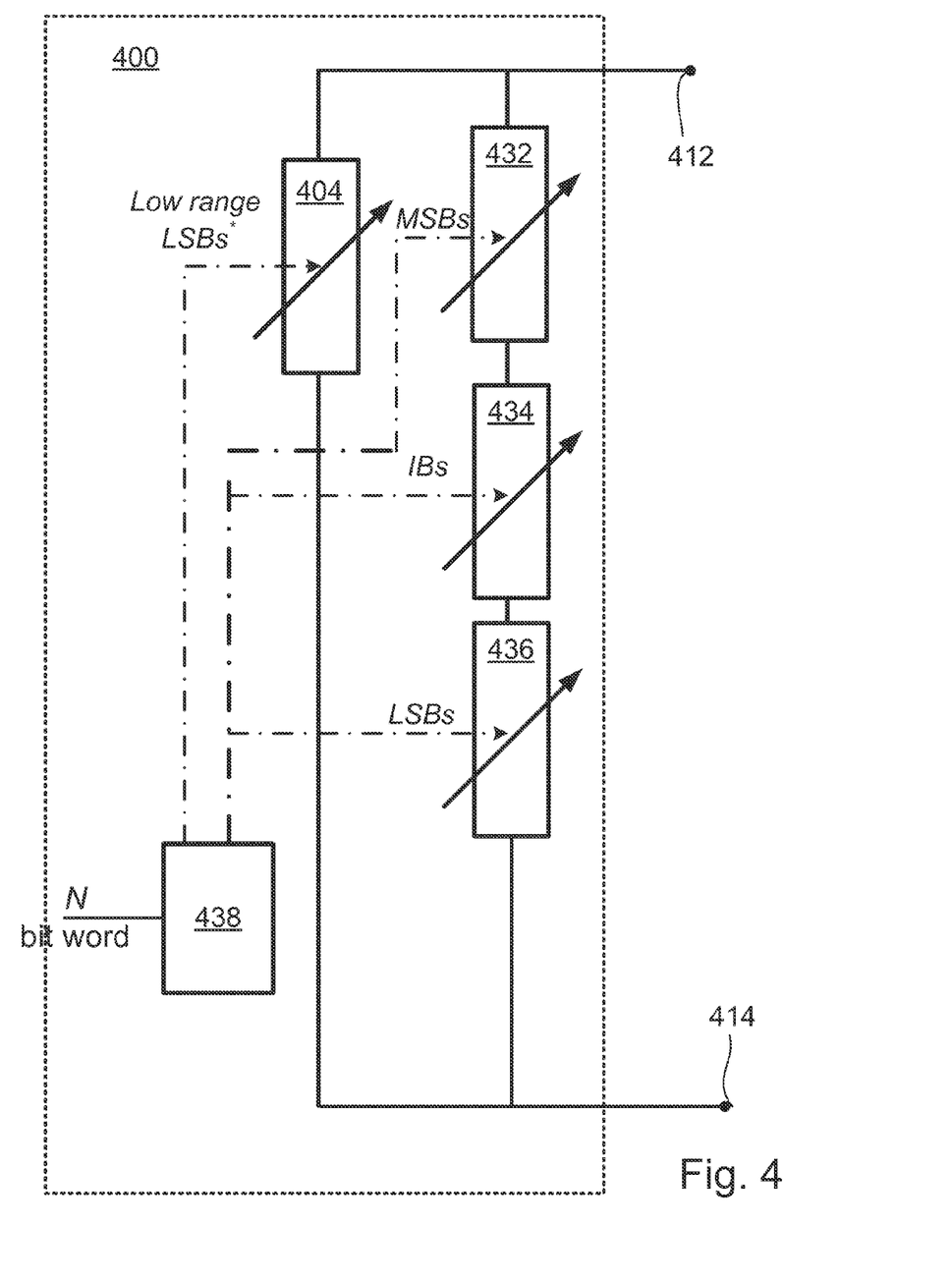
FIG. 4 illustrates an alternative multi-stage approach to that of FIG. 3.

Thus for example, in the arrangement of FIG. 4 there is no discrete separate switch to engage or couple the auxiliary branch across the output nodes 412, 414. Instead the switching function to engage the auxiliary branch is incorporated into the auxiliary programmable impedance 404. Similarly, the switches with the stages 332, 334, 336 of the primary programmable impedance may be employed to disengage or decouple the primary programmable impedance from output nodes 312, 314. In this case, the control logic 438 effects this control directly upon the auxiliary branch 404 and individual stages 432, 434, 434 of the primary branch.

It will be appreciated that FIG. 1 represents a situation in which when one branch is operational the other is disabled (by virtue of switch configuration 110). Or alternatively stated, one branch operates over a first range of input values with the second branch operating over a separate and distinct (or non-overlapping) second range of input values.

However, other arrangements are possible and sometimes desirable as implied by the arrangement of FIG. 4.

Figure 5:
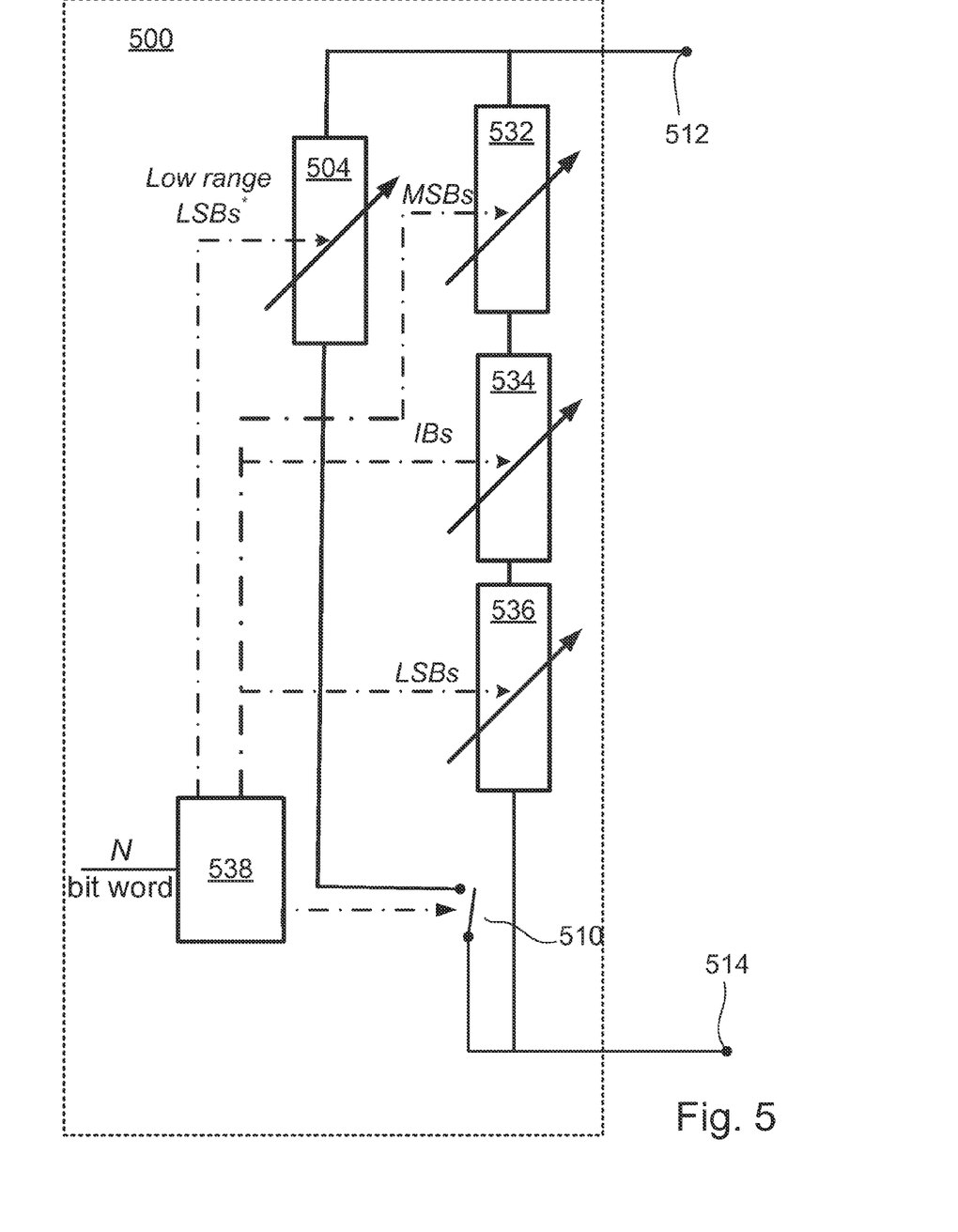
FIG. 5 illustrates another alternative multi-stage approach to that of FIG. 3.

For example, as shown in the arrangement 500 of FIG. 5, the primary branch comprising the multiple stages 532, 534 and 536 are coupled, in one example, across the output nodes 512, 514 so as to provide an impedance output across the entire input range. The auxiliary branch 504 is provided to modify this impedance value at the lower end of the operating range. More particularly, the auxiliary branch augments the performance of the primary branch about the lower end of its range but does not replace it. Again, control logic 538 ensures the requisite impedance is presented by the multiple stages 532, 534, 536 and auxiliary stage 504 across output nodes 512, 514.

In particular, it will be appreciated that a (primary) programmable impedance having switches will inherently have a minimum impedance value arising from the intrinsic impedance $R_{on}$ of the individual switches presented in series between the output nodes. It will be appreciated that this presents a practical minimum impedance that the primary programmable impedance can present across the output nodes. The auxiliary branch augments the performance of the primary programmable impedance allowing an auxiliary impedance to be presented in parallel with the primary programmable impedance across the output nodes allowing the effective impedance presented to be lower than the minimum impedance of the primary programmable impedance.

In this context, it will be appreciated that different switches within the multi-stage programmable impedance may for design considerations be selected to have different intrinsic impedances. Nonetheless, the use of an auxiliary branch allows for the resulting minimum impedance value to effectively be reduced (below the intrinsic resistance values) by switching in one or more other impedances in parallel with the primary programmable impedance.

This has advantage over the earlier presented approach of FIG. 1 where each branch operated over a distinct separate range. In particular, there will be more continuity by modifying an existing impedance by switching in a further impedance in parallel rather than switching over to another impedance entirely.

It will be appreciated that in this case, the impedance values of the auxiliary branch would be scaled to provide a desired impedance when placed in parallel with the primary branch as opposed to providing an impedance value directly as described in the context of FIG. 1 above.

It will be appreciated that the impedances in each of the branches may be any suitable type for example polysilicon or thin film.

The auxiliary branch may only be used for values corresponding to those of the least significant bits employed by the LSB stage of the primary programmable impedance. However, it will be appreciated that the range of the auxiliary branch need not correspond to the same range as that of the LSBs of the primary branch. Thus for example, an LSB stage might be four bits, i.e. 16 values whereas the auxiliary stage may only be used with 6 values. Accordingly, the values are represented in FIGS. 3, 4 and 5 by LSBs* rather than LSBs.

Figure 6:
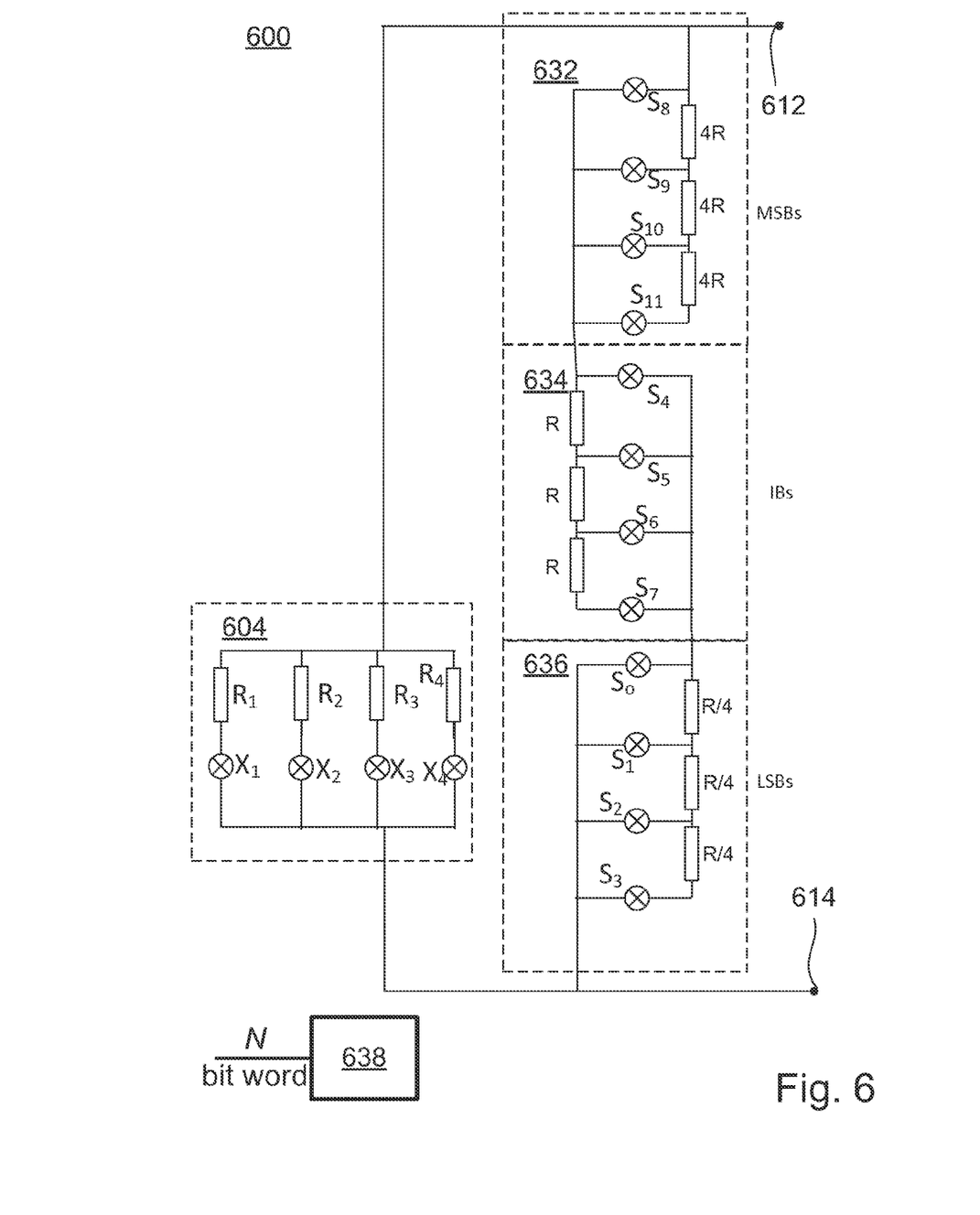
FIG. 6 represents a practical implementation of a multi-stage approach.

An exemplary implementation of an arrangement 600 corresponding generally to that of FIG. 5 is presented in FIG. 6 in which as before an impedance is presented across output nodes 612, 614 in response to an input word presented to a control block 638 which operates switches $X_{1-4}$, $S_{0-11}$ in each of a primary multistage programmable impendance and a parallel auxiliary programmable impedance 604. The primary multistage impedance is arranged in an MSB stage 632 in which there are a series of resistors connected with switches $S_{0-11}$, an IB stage 634 in which there are a series of resistors connected with switches $S_{4-7}$, and finally a LSB stage in which there are a series of resistors connected with switches $S_{0-4}$. The nature of the values of resistance in each of the branches, i.e. 4R, R and R/4 is conventional and it will be appreciated that in this particular arrangement R/4 is reflective of the LSB impedance. It will be appreciated that each of the stages shown 632, 634, 636 is a two bit stage and thus the primary programmable impedance is a 6 bit programmable impedance. The auxiliary branch 604 has 4 impedances $R_{1-4}$ which as described above may be used to augment the performance of the primary programmable impedance. It will be appreciated that the minimum impedance of the primary programmable impedance provided by stages 632, 634 and 636 will be the series combination of the intrinsic impedances of $S_8$, $S_4$ and $S_0$. If the switches are all generally the same, this equates to $3R_{on}$ where $R_{on}$ is the intrinsic on-resistance of a switch. It will be appreciated from the description above, that this minimum effective impedance may be reduced by operating one or more of switches $X_{1-4}$ of the auxiliary branch 604 to connect one or more of resistors $R_{1-4}$ in parallel with this minimum impedance thus reducing the effective minimum resistance and extending the effective range of the primary branch.

Figure 7:
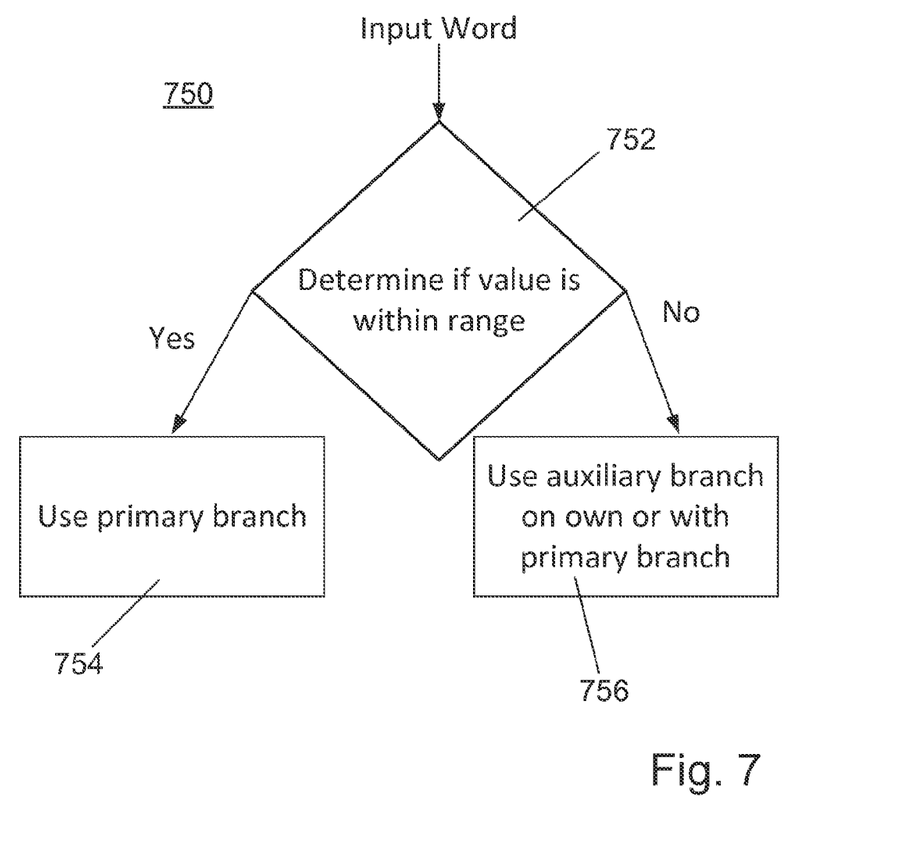
FIG. 7 illustrates a method according to a further aspect of the present application.

The general method employed in the various arrangements shown is presented in the method 750 of FIG. 7, in which a determination 752 is made whether the value of the input word is within the normal operating range of the primary programmable impedance and if so uses 754 the primary branch on its own. Where a determination is made that the input word is outside (below) the normal range the auxiliary branch is employed 756 to augment the performance of the primary programmable impedance.

Figure 8:
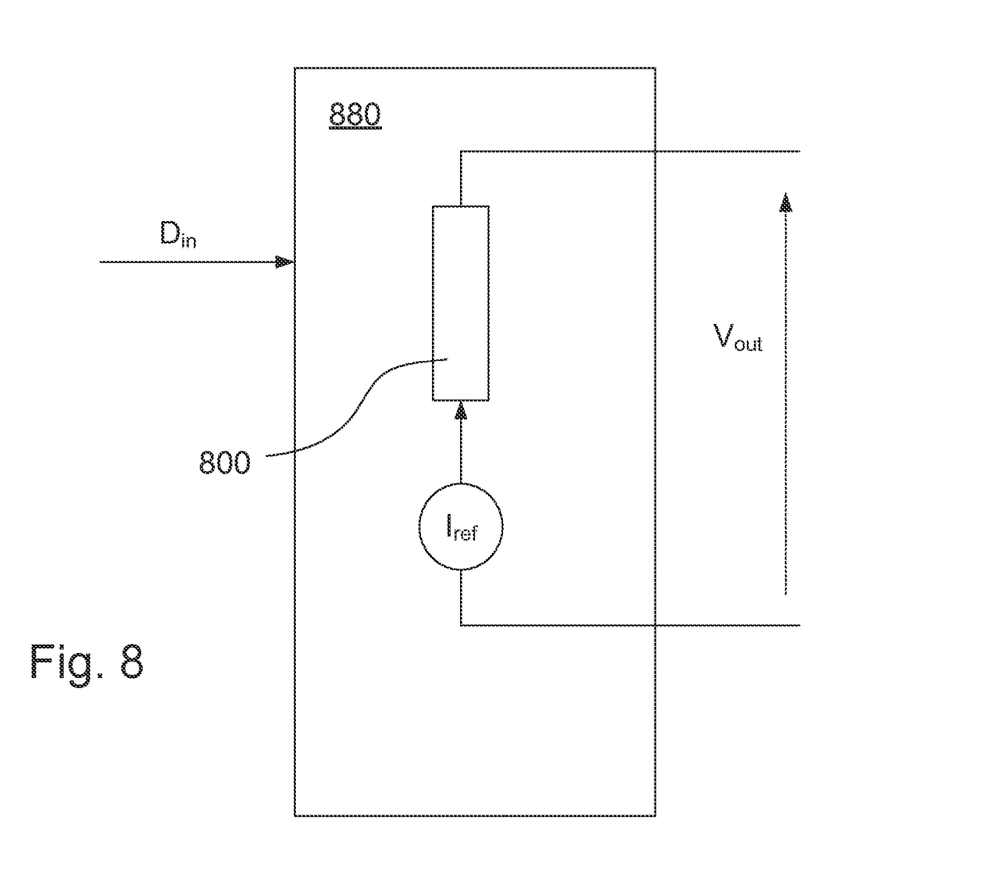
FIG. 8 illustrates a DAC employing a branched programmable resistor of the type shown generally in FIG. 1.

It will be appreciated that programmable impedances as described herein may be used in a wide variety of circuits, including for example as shown in FIG. 8 a DAC 880. In the DAC 880, a digital input word $D_{in}$ is converted into an analog output voltage $V_{out}$ using a reference current ($I_{ref}$) in series with a programmable impedance 800, where the programmable impedance is responsive to the value of $D_{in}$.

Indeed, the controlled (programmable) impedances described above may be used to tune many analog mixed signal (AMS) systems. Digital control of the impedance effects a digital to analog (DAC) conversion, which may be used in setting or tuning reference levels e.g. in resistor divider configuration or other parameters e.g. tuning a bias current, filter response characteristic or timing delay. It also allows for analog control to be used in combination with [master] digital control, with one element being responsive to an analog signal with another being responsive to a digital word.

Whilst the present application has been described in the context of impedances which are shown as resistors and would be viewed as Ohmic, it is not so limited. For example, it will be appreciated that the technique may also be employed with inductance impedances. Similarly, whilst the resistances have been explained in the context of switches and discrete resistors, it will be appreciated that a transistor or other gain switched device may be configured to act as an equivalent Ohmic resistance. Accordingly, impedance in the context of the present application should be taken to include passive impedance devices and equivalent active devices.

Equally, whilst the present application has been described in the context of a digitally programmable resistor having a linear response to a binary word, it will be appreciated that a non-linear response may also be provided allowing for a non-linear digitally programmable resistor. The description is of a conventional binary embodiment as the most common envisaged use case but an alternate number base or number system may be used.

There has been described herein an improved digitally programmable resistor that has distinct advantages when compared with approaches of the prior art. It will be apparent to those skilled in the art that modifications may be made without departing from the spirit and scope of this specification. Accordingly, it is not intended that the claims be limited except according to their express language.

It will be appreciated that the best practice switch design techniques known to those skilled in the art can be used in design and optimization of the switch networks.

For higher resolution digital potentiometers, the LSB resistance may be substantially smaller than easily achieved with near minimum area, or size, switch and increasing resolution will tend to exacerbate this limitation. Whilst the switch impedance can be lowered using best practice design techniques and this reduction also reduces switch impedance variation, also generally desirable, the increasing size of the switch will impact on capacitance, speed, glitching and leakage performance. Hence there is a need to provide for architecture for high resolution digital potentiometer which can overcome or circumvent this limitation. The approach described herein provides for such architecture.

For the lower impedance auxiliary path operation, the number of switches is desirably minimized and the target impedance is achieved by selection of the correct switch or combination of switches to achieve the target impedance between the two reference terminals.

Unless the context clearly requires otherwise, throughout the description and the claims, the words "comprise," "comprising," "include," "Including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements.

Additionally, the words "herein," "above," "below," and words of similar import, when used in this application, refer to this application as a whole and not to any particular portions of this application. Where the context permits, words using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings provided herein can be applied to other systems, not necessarily the circuits described above. For example, the circuits described herein may be applied within computing devices, multimedia devices, communication equipment, networking equipment, audio devices, video devices, or medical devices, by way of nonlimiting example. These may be pure analog devices or mixed-signal devices. The elements and acts of the various embodiments described above can be combined to provide further embodiments. The act of the methods discussed herein can be performed in any order as appropriate. Moreover, the acts of the methods discussed herein can be performed serially or in parallel, as appropriate.

While certain embodiments of the present specification have been described, these embodiments have been presented by way of example only, and are not intended to limit the scope of the disclosure. Indeed, the novel methods and circuits described herein may be embodied in a variety of other forms. Furthermore, various omissions, substitutions and changes in the form of the methods and circuits described herein may be made without departing from the spirit of the disclosure. The accompanying claims and their equivalents are intended to cover such forms or modifications as would fall within the scope and spirit of the disclosure. Accordingly, the scope of the present specification is defined by reference to the claims.

The invention claimed is:

1. A programmable impedance providing an impedance value across two nodes and being responsive to an input code word, the impedance comprising:
    a first branch couplable between the two nodes for use in providing impedance values across a first range of the input code word; and
    a second branch couplable between the two nodes for use in providing impedance values across a second range of the input code word;
    wherein the input code word comprises a plurality of bits and the first branch is responsive to all bits of the plurality of bits.

2. A programmable impedance according to claim 1, wherein the second branch is responsive to a subset of the plurality of bits.

3. A programmable impedance according to claim 1, wherein the first and second ranges overlap.

4. A programmable impedance according to claim 1, where the first and second ranges do not overlap.

5. A programmable impedance according to claim 1, wherein the first branch has a minimum impedance which it can present across the two nodes and where the second branch is configured to allow an impedance value below the minimum impedance to be presented across the two nodes.

6. A programmable impedance according to claim 1, wherein the second branch is configured to provide an impedance value in response to a input code word value in the range from 0 to M, where $M \geq 1$ and where the first branch is configured to provide an impedance value for an input code word value in a range comprising at least M+1 to a maximum value of the input word.

7. A programmable impedance according to claim 1, wherein the second branch is configured to provide an impedance value in response to a input code word value in the range from 0 to M, where $M > 1$, and where the first branch is configured to provide an impedance value for an input code word value in a range comprising at least M+1 to the maximum value of the input word.

8. A programmable impedance according to claim 1, wherein the second branch comprises a plurality of switches arranged in parallel, and where the plurality of the switches are selectably switchable to effect a desired impedance reflective of the input digital word.

9. A programmable impedance according to claim 8, wherein the plurality of switches are scaled relative to one and other.

10. A programmable impedance according to claim 1, wherein the second branch comprises at least one controllable impedance and where the impedance is controllable to effect a desired impedance reflective of the input digital word.

11. An impedance according to claim 1, wherein the impedance of the first branch is configured to be decoupled between the two nodes when the second branch is coupled between the two nodes.

12. An impedance according to claim 1, wherein the second branch is configured to be decoupled when the first branch is coupled.

13. An impedance according to claim 1, wherein the first branch comprises a multi stage controlled impedance.

14. An impedance according to claim 1, wherein the first branch comprises a switchable resistor array.

15. A digital to analog converter comprising the impedance of claim 1.

16. A method of providing an impedance in response to an input value, the method comprising:
    determining that the value is within a determined range of operation of a first programmable impedance; and
    using the first programmable impedance to provide the impedance value;
    wherein the input value comprises a plurality of bits and the first programmable impedance is responsive to all bits of the input.

17. The method of claim 16, further comprising:
  determining that the value is not within a determined range of operation of a first programmable impedance; and
  using a second programmable impedance to provide an extended range of operation, where the extended range of operation provides lower impedance values than those of the determined range of operation.

18. A method according to claim 17, further comprising coupling the first and second programmable impedances in parallel for the extended range of operation.

19. A circuit element providing a impedance value across two nodes in response to an input code word, the circuit element comprising:
  a primary branch, coupled between the two nodes, comprising a programmable impedance configured to be responsive to the input code word to provide a corresponding impedance between the two nodes;
  an auxiliary branch coupled between the two nodes and comprising at least one impedance switchably couplable between the two nodes, wherein the auxiliary branch is configured to be employed to augment the performance of the primary branch allowing for a lower impedance value to be provided between the two nodes than the programmable impedance is capable of providing;
  wherein the input code word comprises a plurality of bits and the primary branch is responsive to all bits of the plurality of bits.

* * * * *